(12) United States Patent
Sir (10) Patent No.: US 7,745,912 B2
(45) Date of Patent: Jun. 29, 2010

(54) STRESS ABSORPTION LAYER AND CYLINDER SOLDER JOINT METHOD AND APPARATUS

(75) Inventor: Jiun Hann Sir, Penang (MY)

(73) Assignee: Intel Corporation, Santa Clara, CA (US)

( * ) Notice: Subject to any disclaimer, the term of this patent is extended or adjusted under 35 U.S.C. 154(b) by 1211 days.

(21) Appl. No.: 11/089,995

(22) Filed: Mar. 25, 2005

(65) Prior Publication Data

US 2006/0214281 A1 Sep. 28, 2006

(51) Int. Cl.
*H01L 23/495* (2006.01)
*H01L 29/40* (2006.01)

(52) U.S. Cl. .................. 257/669; 257/668; 257/697; 257/778

(58) Field of Classification Search .................. 257/668, 257/669, 697, 778
See application file for complete search history.

(56) References Cited

U.S. PATENT DOCUMENTS

| | | | | |
|---|---|---|---|---|
| 5,281,151 A * | 1/1994 | Arima et al. | .................. | 439/68 |
| 5,317,801 A * | 6/1994 | Tanaka et al. | .................. | 29/830 |
| 5,378,306 A * | 1/1995 | Cibulsky et al. | .............. | 216/20 |
| 5,691,041 A * | 11/1997 | Frankeny et al. | ............. | 428/209 |
| 5,770,889 A * | 6/1998 | Rostoker et al. | ............. | 257/698 |
| 5,841,194 A * | 11/1998 | Tsukamoto | .................. | 257/729 |
| 5,848,465 A * | 12/1998 | Hino et al. | ..................... | 29/825 |
| 6,100,585 A * | 8/2000 | Chiba | ......................... | 257/734 |
| 6,137,164 A * | 10/2000 | Yew et al. | .................... | 257/686 |
| 6,229,209 B1 * | 5/2001 | Nakamura et al. | .......... | 257/737 |
| 6,258,627 B1 * | 7/2001 | Benenati et al. | ............. | 438/108 |
| 6,458,622 B1 | 10/2002 | Keser et al. | | |
| 6,579,474 B2 * | 6/2003 | McCormack et al. | ....... | 252/512 |
| 6,639,155 B1 * | 10/2003 | Bupp et al. | ................. | 174/260 |
| 6,777,818 B2 * | 8/2004 | Baldwin | ..................... | 257/795 |
| 7,053,496 B2 * | 5/2006 | Stone | ......................... | 257/798 |
| 7,112,520 B2 * | 9/2006 | Lee et al. | .................... | 438/612 |
| 2001/0054758 A1 * | 12/2001 | Isaak | .......................... | 257/686 |
| 2002/0046880 A1 * | 4/2002 | Takubo et al. | ............... | 174/261 |
| 2003/0146510 A1 * | 8/2003 | Chien | ......................... | 257/738 |
| 2003/0199121 A1 * | 10/2003 | Caletka et al. | ............. | 438/113 |
| 2004/0173891 A1 * | 9/2004 | Imai et al. | ................... | 257/686 |
| 2004/0197955 A1 * | 10/2004 | Lee | .............................. | 438/108 |
| 2004/0262733 A1 * | 12/2004 | Kumamoto | ................. | 257/686 |
| 2005/0035440 A1 * | 2/2005 | Mohammed | ................ | 257/686 |
| 2005/0087855 A1 * | 4/2005 | Khandros et al. | ........... | 257/686 |
| 2005/0121757 A1 * | 6/2005 | Gealer | ........................ | 257/678 |

FOREIGN PATENT DOCUMENTS

| JP | 62-36900 | * | 2/1987 |
|---|---|---|---|
| JP | 2005336287 | * | 12/2005 |

\* cited by examiner

*Primary Examiner*—Matthew C Landau
*Assistant Examiner*—James M Mitchell
(74) *Attorney, Agent, or Firm*—Schwabe, Williamson & Wyatt, P.C.

(57) ABSTRACT

An apparatus, method, and system for providing a stress absorption layer for integrated circuits includes a stiffening layer adapted to limit flexing. A compliance layer is physically associated with the stiffening layer, with the compliance layer adapted to absorb stress caused by mismatched thermal properties between two materials. A thru hole passes through both the stiffening layer and the compliance layer, with the thru hole being adapted to receive a solder joint. The stress absorption layer contacts both a semiconductor package and a substrate. The solder joint disposed in the thru hole connects the semiconductor package to the substrate.

18 Claims, 9 Drawing Sheets

STRESS ABSORPTION LAYER AND CYLINDER SOLDER JOINT METHOD AND APPARATUS

FIELD OF THE INVENTION

Disclosed embodiments of the present invention relate to the field of integrated circuits, and more particularly to providing a stress absorption layer for integrated circuits.

BACKGROUND OF THE INVENTION

With the advancement of integrated circuit technology, the Input and Output (I/O) density required to meet the needs of this integrated circuit technology has increased exponentially. Typically these I/Os include conductive balls formed on a semiconductor package to electrically contact a circuit board substrate. The increase in I/O density has resulted in the introduction of solder joints formed with solder balls of increasingly smaller ball pitch. This use of solder balls having small ball pitch is problematic for the reliability of the resultant solder joints, with the solder joints being more susceptible to failure from board flexing and/or bending stresses.

Stress compensation layer, including a number of processes to form such a layer, has been proposed to prevent damage from mechanical stresses to the solder joints. Typically, it encapsulates either the semiconductor wafer or conductive bumps.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

An apparatus, method, and system for providing a stress absorption layer for integrated circuits in an electronic assembly is disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Figure 1:
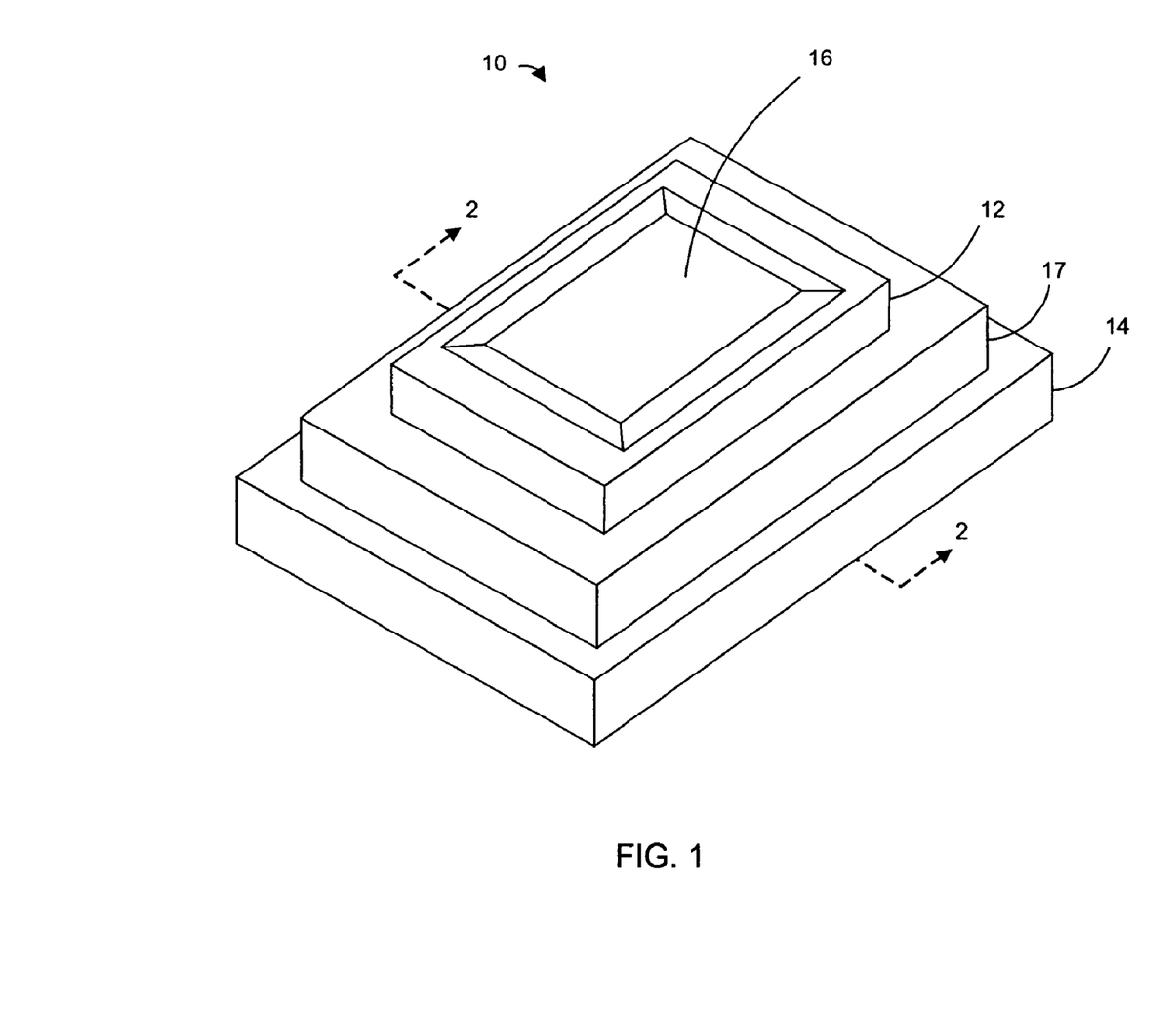
FIG. 1 is a perspective view illustrating an electronic assembly, in accordance with some embodiments of the present invention.

FIG. 1 illustrates a portion of an electronic assembly 10, in accordance with one embodiment. The electronic assembly 10 may include a semiconductor package 12 secured to a substrate 14. The semiconductor package 12 may include an integrated circuit 16. The integrated circuit 16 may be formed in a rectangular piece of semiconductor material called a chip or a die. Examples of the semiconductor material include, but are not limited to silicon, silicon on sapphire, and gallium arsenide. In some embodiments of the present invention, the integrated circuit 16 may be a processor. For example the integrated circuit 16 may be a microprocessor. In some embodiments of the present invention, the substrate 14 may be a printed circuit board.

In some embodiments of the present invention, a stress absorption layer 17 may be located between package 12 and substrate 14. The stress absorption layer 17 may contact both the package 12 and substrate 14. The stress absorption layer 17 may be adapted to limit flexing between the package 12 and substrate 14. The stress absorption layer 17 may be formed to have a compatible thermal property, such as a coefficient of thermal expansion, as compared with one or both of the package 12 and substrate 14. Additionally or alternatively, the stress absorption layer 17 may be adapted to absorb stress caused by mismatched thermal properties between the stress absorption layer 17 and the package 12 and/or between the stress absorption layer 17 and the substrate 14. In some embodiments, the stress absorption layer 17 may be formed as a mechanical insert.

Figure 2:
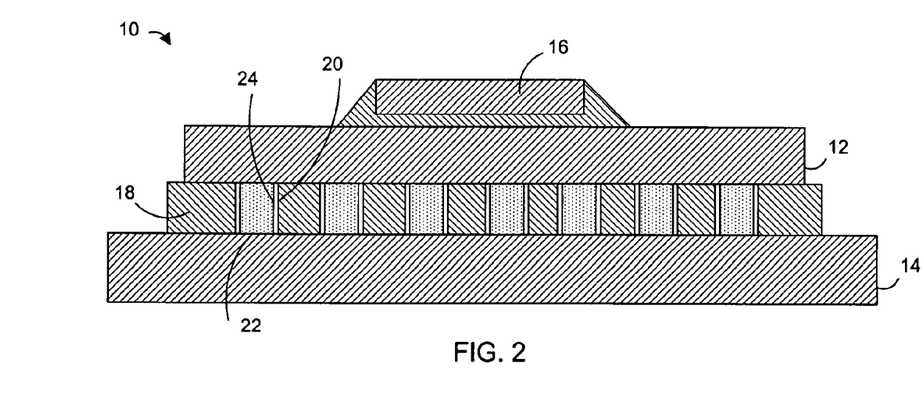
FIG. 2 is a cross sectional view taken along line 2-2 in FIG. 1 illustrating an example electronic assembly, in accordance with an embodiment of the present invention.

FIG. 2 illustrates an example electronic assembly 10, in accordance with an embodiment of the present invention. The mechanical insert 18 may include one or more thru holes 20. The thru hole 20 may pass completely through the mechanical insert 18. The thru hole 20 may be adapted to receive a solder joint 22 connecting the package 12 to the substrate 14. The thru hole 20 and solder joint 22 may be cylindrical in shape. A metallic plating 24 may be plated on the thru hole 20. The metallic plating 24 on the thru hole 20 may be adapted to metallurgically bond to the solder joint 22. The metallic plating 24 on the thru hole 20 may be formed of any suitable material, according to the requirements of the particular application. Examples of materials suitable for forming the metallic plating 24 on the thru hole 20 include, but are not limited to copper.

Figure 3:
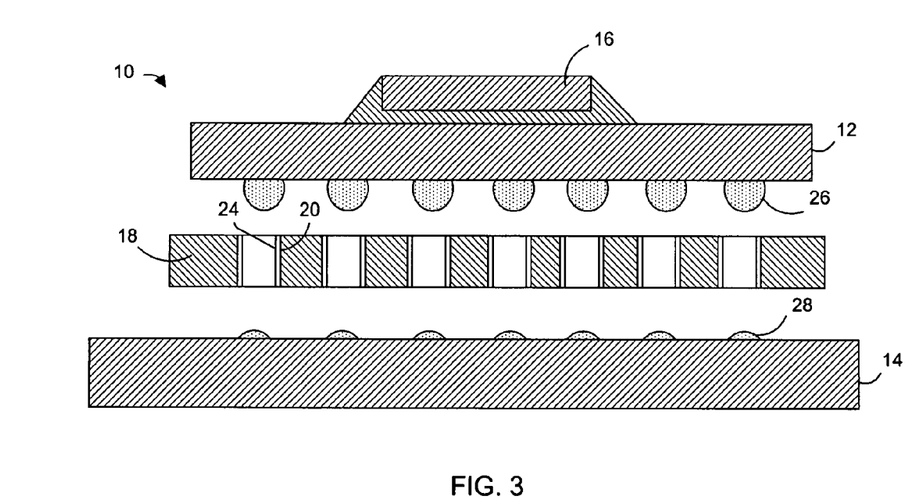
FIGS. 3-4 are cross sectional views taken along line 2-2 in FIG. 1 illustrating the example electronic assembly of FIG. 2 at various stages of construction, in accordance with an embodiment of the present invention.
Figure 4:
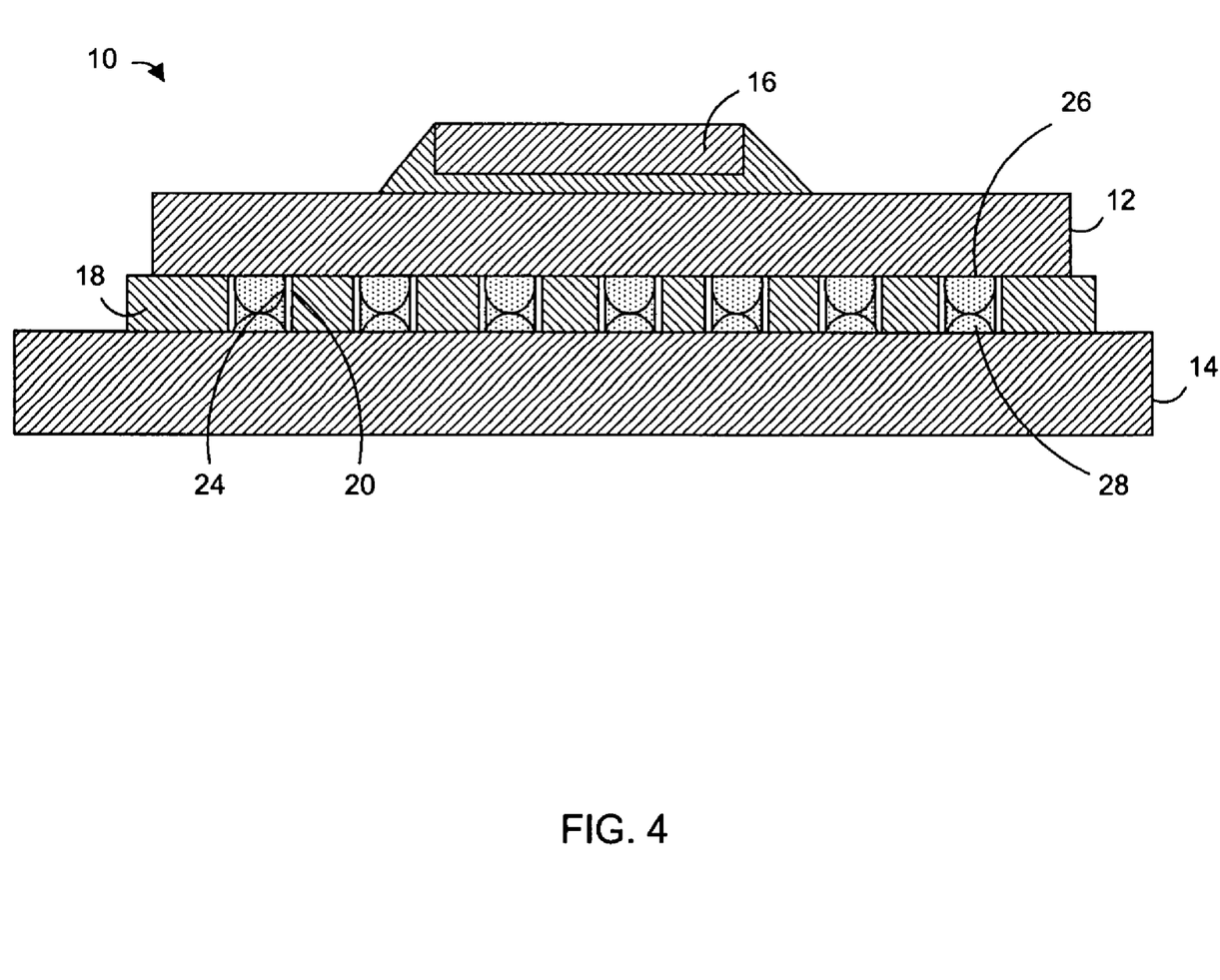

FIGS. 3-4 illustrate the example electronic assembly 10 at a given stage of construction, in accordance with an embodiment of the present invention. Solder deposit 26 may be formed on the bottom surface of the package 12 to face the substrate 14. The solder deposit 26 may be formed as a solder ball or other suitable shape, according to the requirements of the particular application. Similarly, solder contact 28 may be formed on the upper surface of the substrate 14 to face the package 12. The thru hole 20 of mechanical insert 18 may be adapted to receive the solder deposit 26 on the package 12. Likewise, the thru hole 20 of mechanical insert 18 may be adapted to receive the solder contact 28 of the substrate 14. The mechanical insert 18 may be assembled between the package 12 and the board 14. Once the mechanical insert 18 is assembled between the package 12 and the board 14, reflow of the solder deposit 26 and the solder contact 28 may be performed. The reflow of the solder deposit 26 and the solder contact 28 within the thru hole 20 creates a cylindrical solder joint 22 (FIG. 2) formed within the thru hole 20 of the mechanical insert 18. This cylindrical solder joint 22 (FIG. 2) may be bonded to the metallic plating 24 of the thru hole 20 in the mechanical insert 18.

Figure 5:
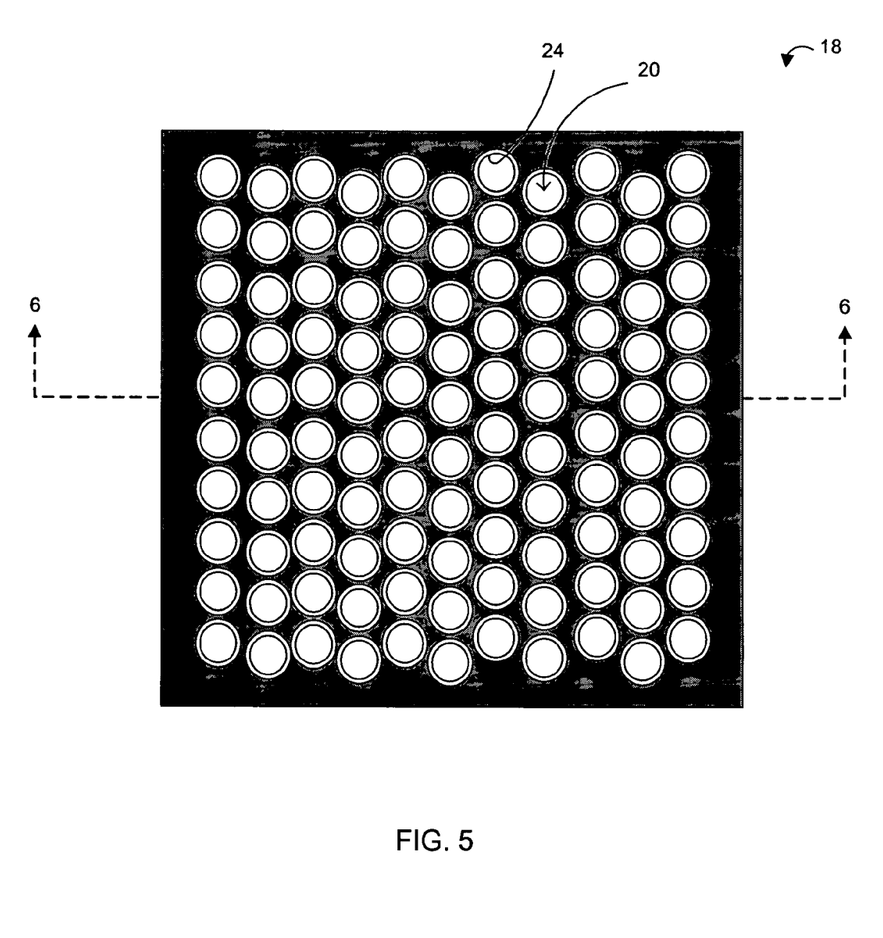
FIG. 5 is a top view illustrating an example stress absorption layer, in accordance with some embodiments of the present invention.

FIG. 5 illustrates a stress absorption layer in accordance with an embodiment of the present invention. The thru holes 20 of mechanical insert 18 may be formed as an array of thru holes 20. The array of thru holes 20 of mechanical insert 18 may be adapted align the solder deposit 26 on the package 12 (FIG. 4) with the corresponding solder contact 28 of the substrate 14 (FIG. 4).

Figure 6:
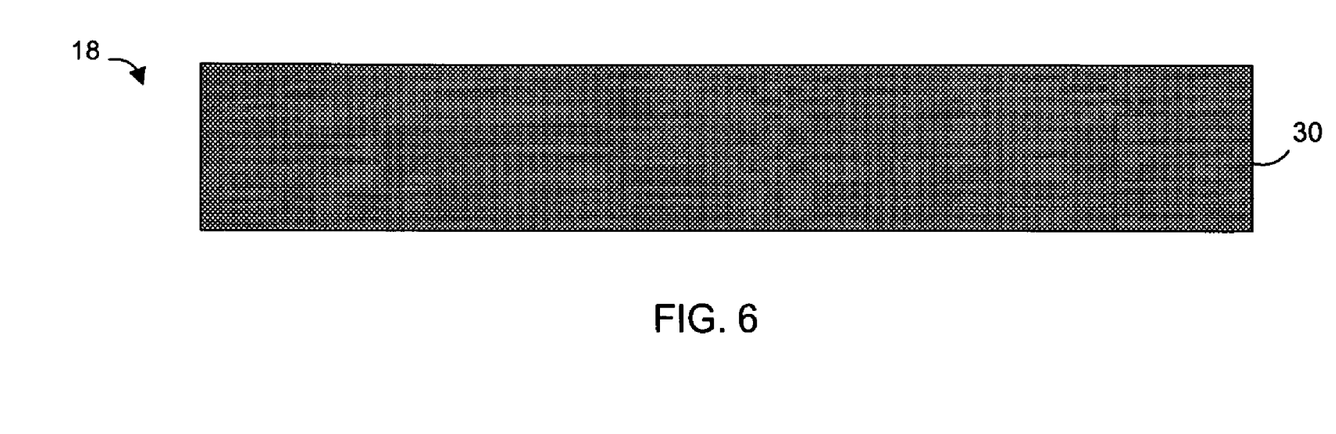
FIGS. 6-13 are cross sectional views taken along line 6-6 in FIG. 5 illustrating the example stress absorption layer of FIG. 5 at various stages of construction, in accordance with an embodiment of the present invention.

FIG. 6 illustrates a stress absorption layer at a given stage of construction, in accordance with an embodiment of the present invention. The mechanical insert 18 may include a stiffening layer 30. The stiffening layer 30 of the mechanical insert 18 may be adapted to limit flexing of the mechanical insert 18. Additionally or alternatively, the stiffening layer 30 may be adapted to limit flexing between the package 12 and a substrate 14. The stiffening layer 30 of the mechanical insert 18 may be formed to have a compatible thermal property, such as a coefficient of thermal expansion, as compared with one or both of the package 12 and substrate 14. The stiffening layer 30 of the mechanical insert 18 may be formed of any suitable material, according to the requirements of the particular application. Examples of materials suitable for forming the stiffening layer 30 of the mechanical insert 18 include, but are not limited to a composite material including reinforcers and resin. Examples of reinforcer materials suitable for forming the stiffening layer 30 of the mechanical insert 18 include but are not limited to fiber, woven glass fiber, expanded PTFE, and the like. Examples of resin materials suitable for forming the stiffening layer 30 of the mechanical insert 18 include but are not limited to epoxy resin, hydrocarbon/ceramic, thermoset polyester, and the like. Examples of commercially available materials suitable for forming the stiffening layer 30 of the mechanical insert 18 include, but are not limited to Rogers CCL/pp R04000 series, Gil CCL GML 1032, Gil CCL GML 1034, GETEK CCL/pp GETEK II, Gore prepreg Speedboard C, and Gore prepreg Microlam 410.

Figure 7:
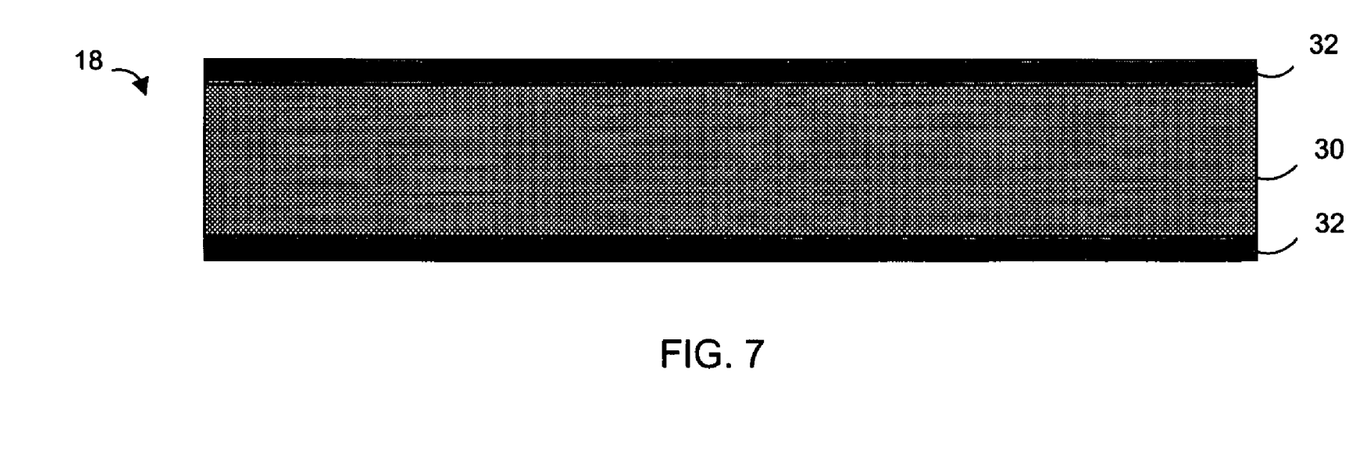

FIG. 7 illustrates a stress absorption layer at a given stage of construction, in accordance with an embodiment of the present invention. The mechanical insert 18 may include a compliance layer 32. The compliance layer 32 may be physically associated with the stiffening layer 30. The compliance layer 32 may extend from an upper and lower surface of the stiffening layer 30 towards the package 12 (FIG. 4) as well as the substrate 14 (FIG. 4). The compliance layer 32 of the mechanical insert 18 may be adapted to absorb stress caused by mismatched thermal properties between two materials. Additionally or alternatively, the compliance layer 32 of the mechanical insert 18 may be adapted to absorb stress caused by mismatched thermal properties between the mechanical insert 18 and the package 12 and/or between the mechanical insert 18 and the substrate 14. The compliance layer 32 of the mechanical insert 18 may be formed of any suitable material, according to the requirements of the particular application. Examples of materials suitable for forming the compliance layer 32 of the mechanical insert 18 include, but are not limited to an elastomer. The compliance layer 32 of the mechanical insert 18 may be physically associated with the stiffening layer 30 by any suitable method, according to the requirements of the particular application. Examples of methods suitable for, physically associating the compliance layer 32 of the mechanical insert 18 with the stiffening layer 30 include, but are not limited to lamination.

Figure 8:
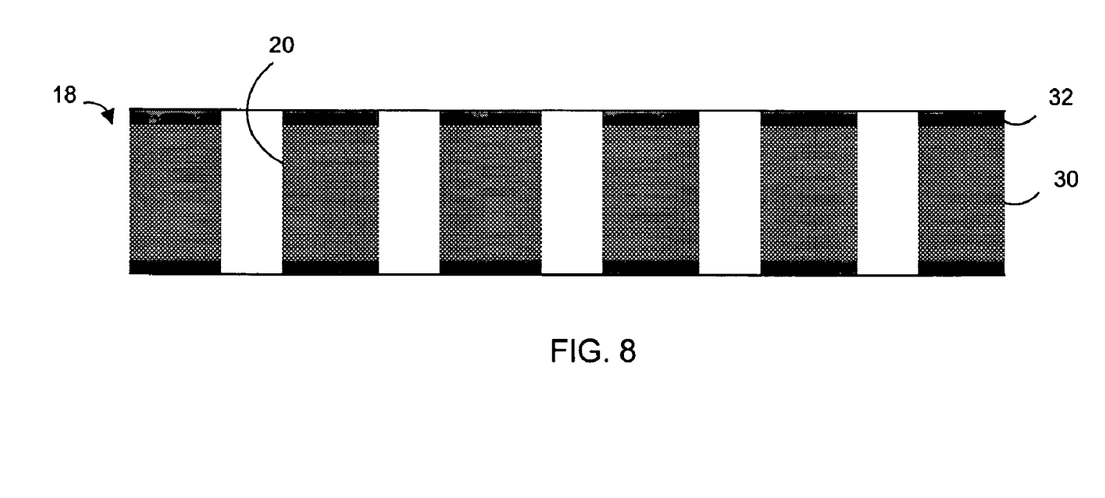

FIG. 8 illustrates a stress absorption layer at a given stage of construction, in accordance with an embodiment of the present invention. The thru holes 20 of the mechanical insert 18 may be formed to pass through both the stiffening layer 30 and the compliance layer 32. The thru holes 20 of the mechanical insert 18 may be formed by any suitable method, according to the requirements of the particular application. Examples of methods suitable for forming the thru holes 20 of the mechanical insert 18 include, but are not limited to mechanical drilling, laser drilling, and the like.

Figure 9:
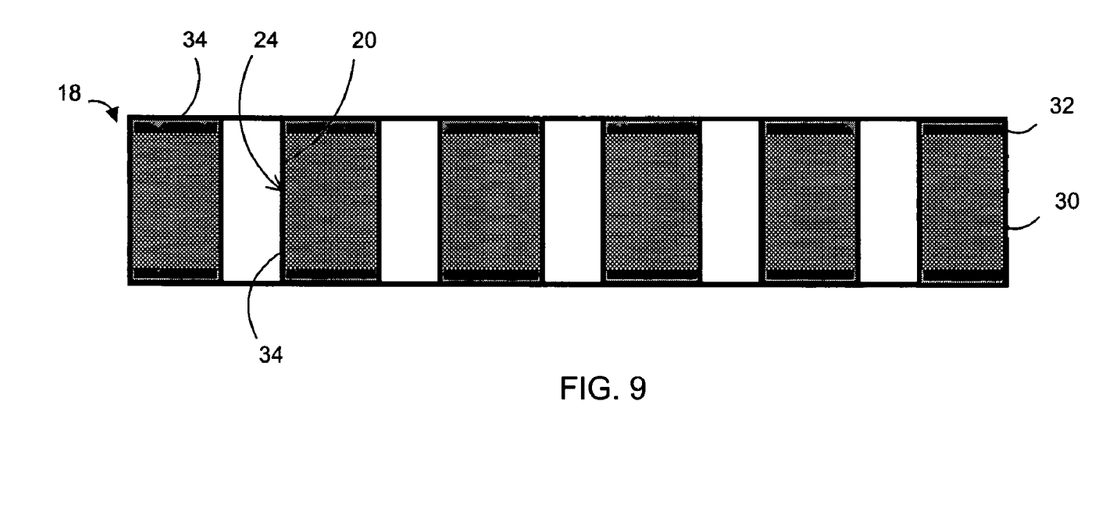

FIG. 9 illustrates a stress absorption layer at a given stage of construction, in accordance with an embodiment of the present invention. The metallic plating 24 of the mechanical insert 18 may be formed of any suitable material, according to the requirements of the particular application. Examples of materials suitable for forming at least a portion of the metallic plating 24 of the mechanical insert 18 include, but are not limited to copper. The metallic plating 24 of the mechanical insert 18 may be formed by any suitable method, according to the requirements of the particular application. Examples of methods suitable for forming metallic plating 24 of the mechanical insert 18 include, but are not limited to electroless plating. As shown, a layer of electroless copper 34 is plated over the mechanical insert 18 including the thru holes 24 and the upper and lower surfaces of the compliance layer 32.

Figure 10:
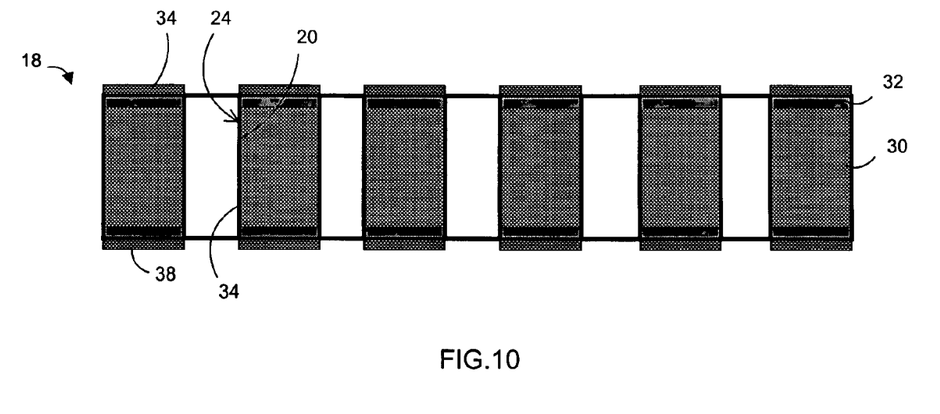
Figure 11:
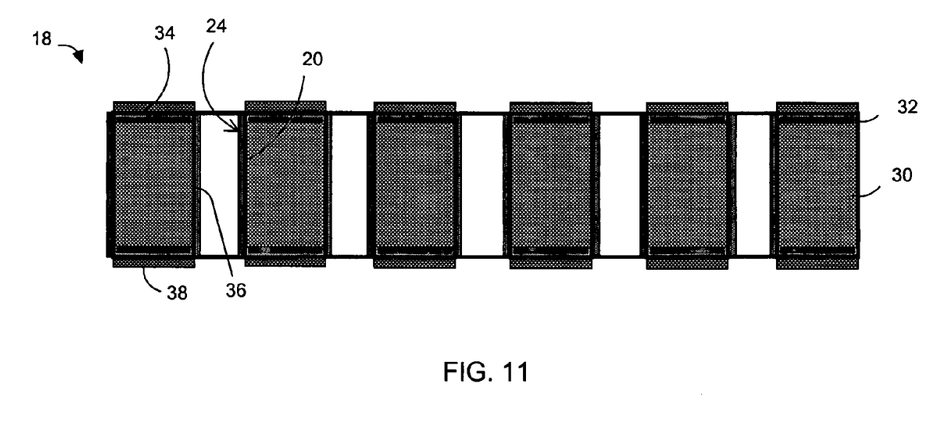
Figure 12:
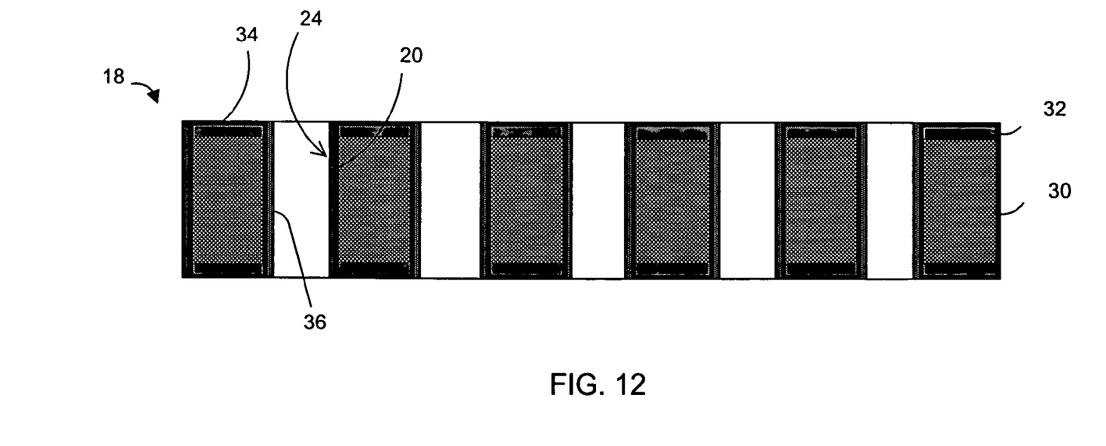

FIGS. 10-12 illustrate a stress absorption layer at given stages of construction, in accordance with an embodiment of the present invention. The metallic plating 24 of the mechanical insert 18 may be formed by any suitable method, according to the requirements of the particular application. Examples of methods suitable for forming metallic plating 24 of the mechanical insert 18 include, but are not limited to electrolytic plating. As shown, a layer of electrolytic copper 36 is plated onto the electroless copper 34 located within the thru holes 24. Prior to the electrolytic copper 36 plating, a dry film 38 is formed via lamination and development on the upper and lower surfaces of the compliance layer 32, thus restricting the copper 36 plating to the thru holes 24. After plating of the electrolytic copper 36, the dry film 38 is removed by a stripping process.

Figure 13:
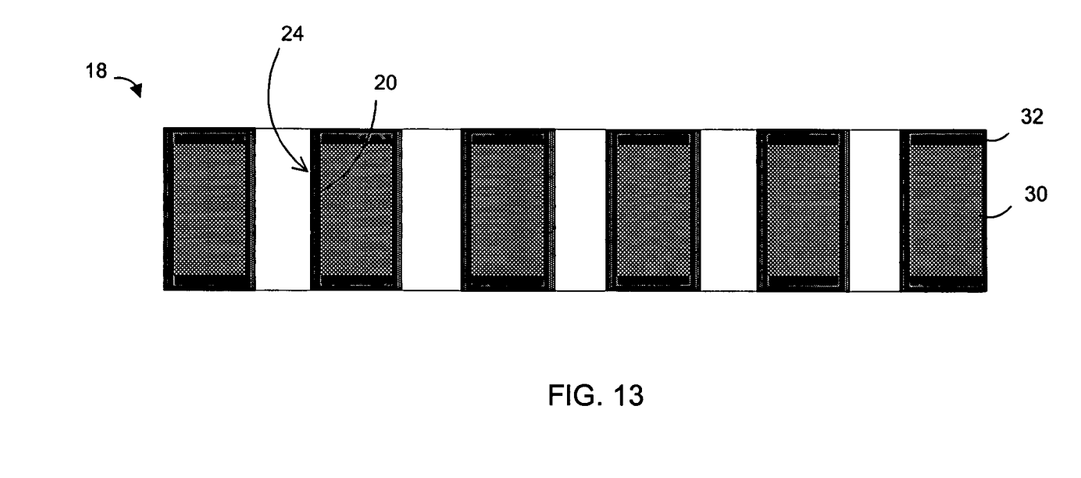

FIG. 13 illustrates a stress absorption layer at a given stage of construction, in accordance with an embodiment of the present invention. Excess metallic plating 24 of the mechanical insert 18 formed on the upper and lower surfaces of the compliance layer 32 may be removed. For example, a quick etch may be performed on the mechanical insert 18 to remove electroless copper 34 (not shown) from the upper and lower surfaces of the compliance layer 32.

Figure 14:
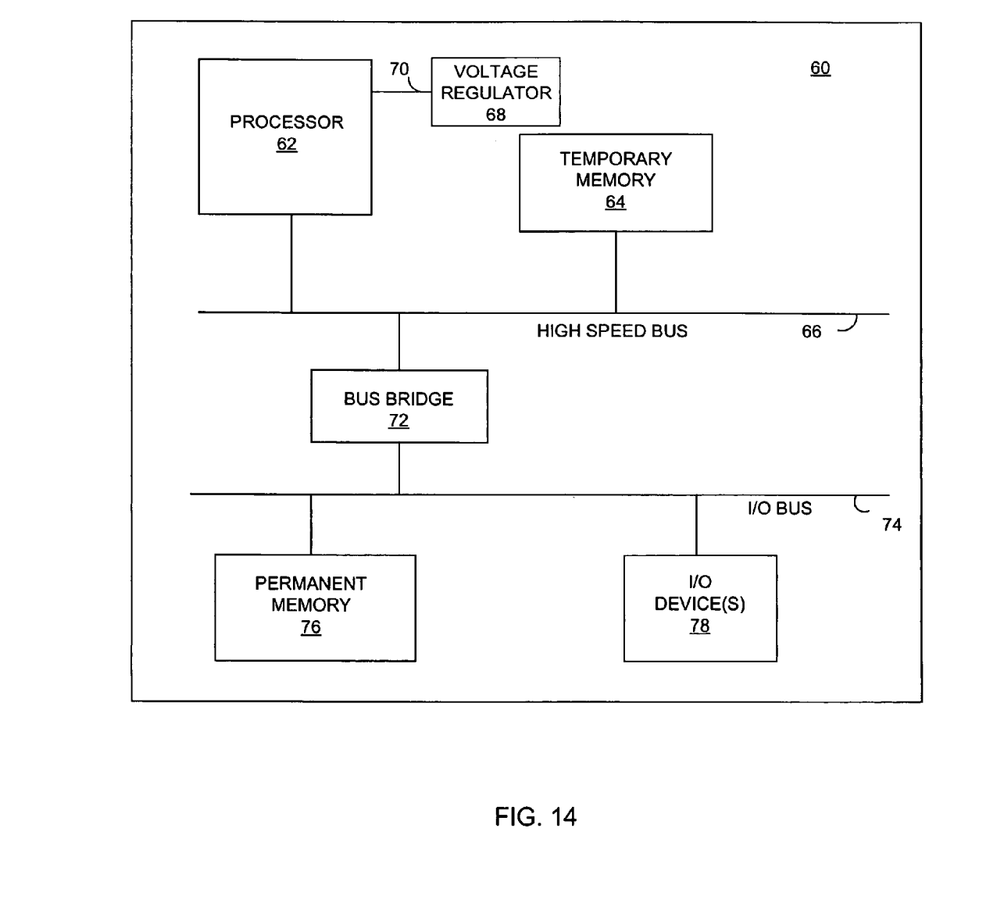
FIG. 14 is a system including an electronic assembly in accordance with an embodiment of the present invention.

FIG. 14 illustrates a block diagram of one of many possible electronic systems 60 in which embodiments of the present invention may be used. The electronic system 60 may utilize one or more embodiments of the electronic assembly 10 described herein. As shown, the system 60 includes a processor 62, such as an integrated circuit, and temporary memory 64, such as SDRAM and DRAM, on high-speed bus 66. Voltage regulator 68 may be utilized to provide power to processor 62 via traces 70. The high-speed bus 66 is connected through bus bridge 72 to input/output (I/O) bus 74. I/O bus 74 connects permanent memory 76, such as flash devices and mass storage device (e.g. fixed disk device), and I/O devices 78 to each other and bus bridge 72.

In various embodiments, system 60 may be a set-top box, a digital camera, a CD player, a DVD player, a wireless mobile phone, a tablet computing device, or a laptop computing device.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
    a semiconductor package including a die mounted on a package substrate;
    a printed circuit board;
    a non-conductive stiffening layer configured to limit flexing, the stiffening layer having a first surface and a second surface;
    a non-conductive first compliance layer physically associated with the first surface of the stiffening layer and in direct physical contact with a major surface of the package substrate;
    a non-conductive second compliance layer physically associated with the second surface of the stiffening layer opposite the first surface, and in direct physical contact with a major surface of the printed circuit board, at least one of the first compliance layer and the second compliance layer being configured to absorb stress between the stiffening layer and at least one of the semiconductor package and the printed circuit board; and
    a thru hole passing through the stiffening layer, the first compliance layer, and the second compliance layer.

2. The apparatus of claim 1, wherein the stiffening layer is adapted to limit flexing between a semiconductor package and a printed circuit board.

3. The apparatus of claim 1, wherein the stiffening layer is a composite material including a reinforcer and a resin.

4. The apparatus of claim 3, wherein the reinforcer is a fiber, woven glass, or expanded PTFE, and wherein the resin is epoxy, a hydrocarbon, ceramic, or thermoset polyester.

5. The apparatus of claim 1, wherein at least one of the first compliance layer and the second compliance layer is adapted to absorb stress caused by mismatched thermal properties between the mechanical insert and a selected one of a semiconductor package and a printed circuit board.

6. The apparatus of claim 1, wherein at least one of the first compliance layer and the second compliance layer includes an elastomer.

7. The apparatus of claim 1, further comprising a plurality of other thru holes forming an array.

8. The apparatus of claim 1, further comprising a solder joint in the thru hole.

9. The apparatus of claim 8, wherein the solder joint is cylindrical in shape and entirely within the thru hole.

10. The apparatus of claim 8, wherein the thru hole includes metallic plating.

11. The apparatus of claim 10, wherein the metallic plating is adapted to metallurgically bond to the solder joint.

12. The apparatus of claim 10, wherein the metallic plating is copper.

13. The apparatus of claim 1, wherein the die is mounted on a first major surface of a package substrate, and the non-conductive first compliance layer is in direct physical contact with a second major surface of the package substrate, the second major surface of the package substrate being opposite the first major surface of the package substrate.

14. A system comprising:
    a semiconductor package including a die mounted on a package substrate;
    a printed circuit board;
    a mechanical insert including:
        a non-conductive stiffening layer configured to limit flexing;
        a non-conductive first compliance layer physically associated with a first surface of the stiffening layer and in direct physical contact with a major surface of the package substrate;
        a non-conductive second compliance layer physically associated with a second surface opposite the first surface of the stiffening layer, and in direct physical contact with a major surface of the printed circuit board, at least one of the first compliance layer and the second compliance layer configured to absorb stress between the mechanical insert and at least one of the semiconductor package and the printed circuit board; and
        a thru hole passing through the stiffening layer, the first compliance layer, and the second compliance layer;
    a solder joint disposed in the thru hole and connecting the semiconductor package to the printed circuit board;
    a bus coupled to the semiconductor package; and
    a mass storage coupled to the bus.

15. The system of claim 14, wherein the system is selected from the group consisting of a set-top box, a digital camera, a CD player, a DVD player, a wireless mobile phone, a tablet computing device, and a laptop computing device.

16. The system of claim 14, wherein the thru hole includes metallic plating, and the solder joint is metallugically bonded to the metallic plating.

17. The system of claim 14, wherein the stiffening layer is adapted to limit flexing between the semiconductor package and the printed circuit board.

18. The system of claim 14, wherein the die is mounted on a first major surface of a package substrate, and the non-conductive first compliance layer is in direct physical contact with a second major surface of the package substrate, the second major surface of the package substrate being opposite the first major surface of the package substrate.

* * * * *